United States Patent
Burke (10) Patent No.: US 11,013,158 B1
(45) Date of Patent: May 18, 2021

(54) ELECTRICAL SHIELDING MATERIAL COMPOSED OF METALLIZED STAINLESS STEEL OR LOW CARBON STEEL MONOFILAMENT YARNS

(71) Applicant: MICROMETAL TECHNOLOGIES, INC, Newburyport, MA (US)

(72) Inventor: Thomas F. Burke, Wayland, MA (US)

(73) Assignee: MICROMETAL TECHNOLOGIES, INC., Newburyport, MA (US)

( * ) Notice: Subject to any disclaimer, the term of this patent is extended or adjusted under 35 U.S.C. 154(b) by 0 days.

(21) Appl. No.: 16/995,406

(22) Filed: Aug. 17, 2020

(51) Int. Cl.
 *H05K 9/00* (2006.01)

(52) U.S. Cl.
 CPC .................. *H05K 9/009* (2013.01)

(58) Field of Classification Search
 CPC ...................................................... H05K 9/009
 See application file for complete search history.

(56) References Cited

U.S. PATENT DOCUMENTS

| | | |
|---|---|---|
| 4,678,699 A | 7/1987 | Kritchevsky et al. |
| 4,740,666 A * | 4/1988 | Tomalin .................. B23H 7/08 219/69.12 |
| 5,103,067 A | 4/1992 | Aldissi |
| 5,180,884 A | 1/1993 | Aldissi |
| 5,473,113 A | 12/1995 | Aldissi |
| 7,291,391 B2 | 11/2007 | Watson et al. |
| 10,314,215 B2 | 6/2019 | Burke et al. |
| 2005/0006126 A1 | 1/2005 | Aisenbrey |
| 2007/0000127 A1 | 1/2007 | Bruzek et al. |
| 2009/0050362 A1 * | 2/2009 | Burke .................. H01B 13/225 174/388 |
| 2013/0008708 A1 | 1/2013 | Burke |

FOREIGN PATENT DOCUMENTS

JP 2020-21620 A 2/2020

OTHER PUBLICATIONS

ASTM B452-09 (reapproved 2015): Standard Specification for Copper-Clad Steel Wire for Electronic Application. ASTM International, Jun. 20, 2017.

\* cited by examiner

*Primary Examiner* — Hung V Ngo
(74) *Attorney, Agent, or Firm* — Preti Flaherty; Beliveau & Pachios LLP (57) ABSTRACT

An RFI/EMI shielding material composed of a conductive multi-fiber having a plurality of metalized monofilaments, each monofilament including a composite core of copper clad stainless steel or low carbon steel reduced to an intermediate diameter, and at least one layer of metal or metal alloy electroplated on the clad copper of the composite core, where each of the monofilaments is drawn after electroplating to a final diameter less than the intermediate diameter, in the range of about 45-78 μm.

15 Claims, 4 Drawing Sheets

ELECTRICAL SHIELDING MATERIAL COMPOSED OF METALLIZED STAINLESS STEEL OR LOW CARBON STEEL MONOFILAMENT YARNS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The invention relates to yarns and multi-fibers comprised of metallized stainless steel or mild steel monofilaments suitable for use as RFI/EMI shielding materials especially for military and aerospace purposes.

Figure 1:
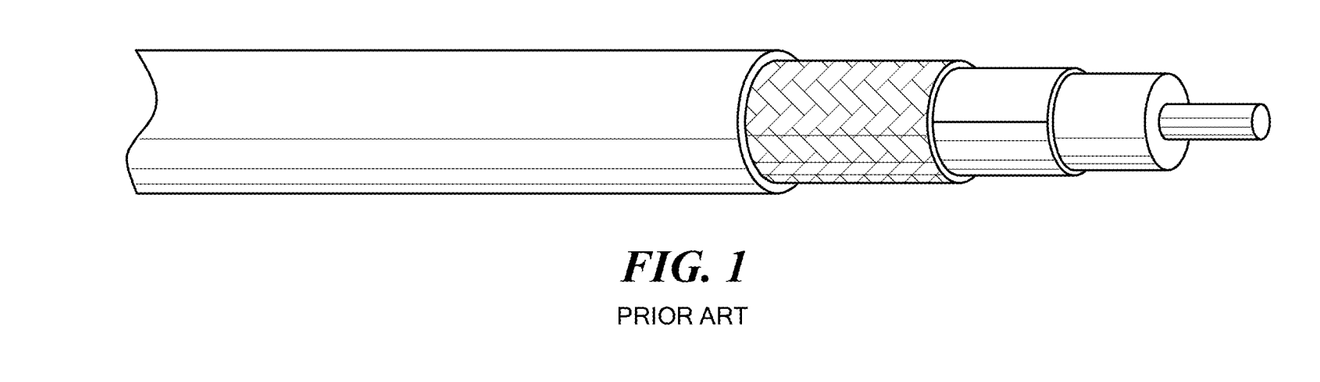
FIG. 1 is a cut-away drawing showing a braided shield in a typical coaxial cable construction (internal shield)
Figure 2:
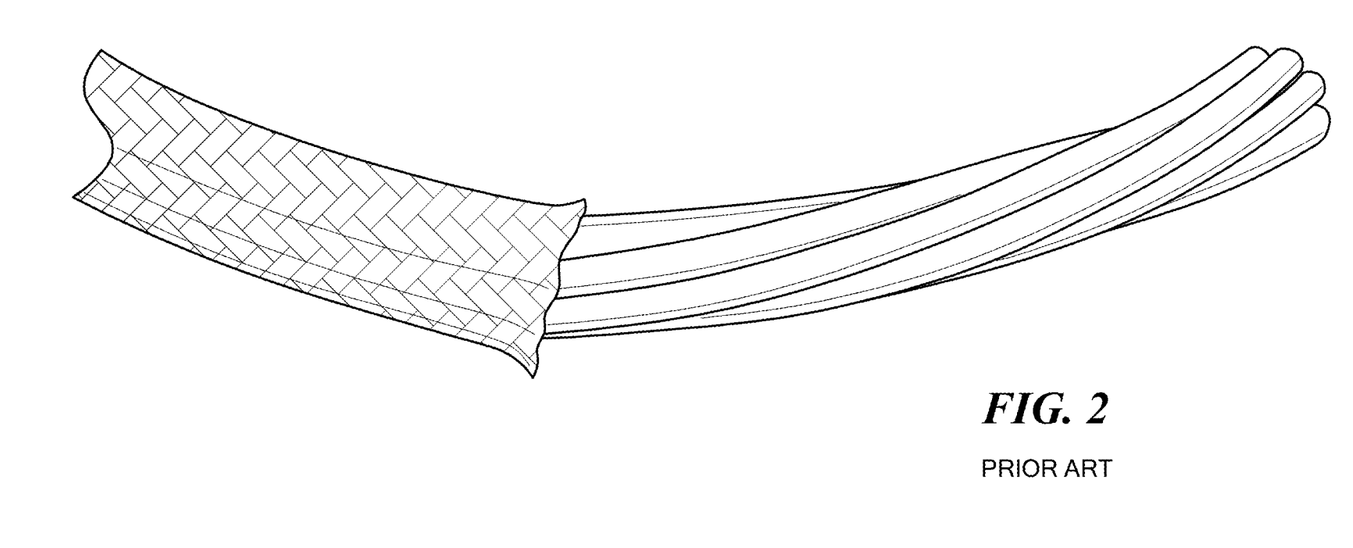
FIG. 2 is an image of a braided shield applied to a group of cables (external shield)

As the complexity of electronic systems in aerospace applications has grown, designers of the cables that interconnect system components have been obliged to meet increasingly stringent requirements for RFI/EMI protection and, because aircraft performance and operating cost are directly related to weight, demand for lighter weight cable constructions. For cable assemblies with internal shielding, RFI/EMI protection takes the form of a braided mesh that is applied over the core in the cable manufacturing process (FIG. 1). For cable assemblies without internal shielding, RFI/EMI protection takes the form of a separately-produced braided wire mesh sleeve (tubing) that is fitted over a cable or cable bundle (FIG. 2) and grounded by clamping the sleeve ends to the terminating connectors. As such, the sleeve also provides the cable assembly with protection against the aggressive mechanical, thermal, and chemical conditions characteristic of the military/aerospace application environment.

Braided RFI/EMI shielding functions by converting incident electromagnetic energy (which may originate within as well as exterior to the cable) into a current that is carried to ground by the shield; in this regard, the shield acts as both a "transducer" and a "conductor". Shielding effectiveness (SE), a measure of the degree to which incident EMI energy is attenuated by the braided shield, is the resultant of several factors: the resistivity of the shield material; the number of shield layers; and the "optical coverage" or degree to which the braided shield covers the surface compared to an idealized solid cylindrical shield. RFI/EMI energy levels are typically low but braided shielding incorporated into aircraft grounding schemes must also provide enough conductive capacity to withstand lightning strike or electrical fault energies.

Conventional braided shielding is fabricated into flexible tubing from #34 or #36 AWG solid copper wires (0.160 mm or 0.125 mm, 6.3 or 5.0 mils diameter respectively) that are plated with nickel, tin, or silver to provide corrosion protection for the underlying copper. Due to its excellent conductivity, adequate strength, and low cost, plated copper wire has been the "material of choice" in braided tubing designs for many years. However, in a growing number of military/aerospace applications, copper wire-based materials cannot satisfy the more stringent shielding requirements and weight restrictions that are specified in new cable designs. As RFI/EMI frequency increases, its correspondingly shorter wavelengths can leak through the gaps or "windows" in the mesh where the relatively thick ribbons of stiff copper wire intersect. When this occurs, Electromagnetic Compliance (EMC) may necessitate the use of more than one layer of shielding with its attendant weight and stiffness penalties. Moreover, when RFI/EMI induces a current in the shield, the "skin effect" phenomenon confines the current flow to the circumferential surface of the copper wire, which has the effect of rendering the wire core "dead weight". Braided wire mesh fabricated from smaller diameter wires would presumably improve shielding effectiveness as well as reduce cable weight, but copper wires finer than #36 AWG are too prone to breakage in the braiding process.

DISCUSSION OF RELATED ART

One solution to these problems is proposed in U.S. Pat. No. 5,103,067 issued to Aldissi on Jan. 19, 1993 and related U.S. Pat. Nos. 5,180,884 and 5,473,113 wherein the performance and weight-reduction advantages of metal-coated polymeric fibers for internal cable shielding is described. In this approach, yarns of micron-diameter aramid monofilaments having high strength-to-weight ratio and flexibility are metallized with one or more thin layers of conductive material, then braided or knitted into a tight mesh. The high tensile strength of the aramid monofilaments provides mechanical strength in a small diameter form factor that contributes to improved shielding performance by reducing the size of the gaps in the mesh. The flexibility that the polymeric yarns impart to this braided construction also provides greater conformity to the surface of the underlying insulation, thereby expanding the frequency range over which the shielding is effective. Finally, even with its conductive coating, metallized aramid yarn weighs much less than its conventional copper wire counterpart.

Despite these attributes, the metallized aramid yarn noted above does not completely address the needs of cable designers. The chief drawback is its cost—more than 20 times that of conventional plated wire—which effectively limits its use to selected aerospace applications such as satellites and military aircraft where the performance penalty related to excess weight is very high. The high cost of metallized aramid yarn is attributable to its necessary reliance on an electroless deposition process, which is not only much slower but involves much more expensive chemistry than electrolytic methods, to form the first conductive layer on the polymeric monofilaments. Furthermore, although its performance is superior to conventional materials, metallized aramid yarn is not optimal with respect to either coverage or conductivity, two factors that affect shielding effectiveness. Smaller diameter aramid monofilaments would permit braided shields to be made with smaller air gaps but constructions of metallized aramid yarn are limited to 15 micron diameter monofilaments due to the fact that smaller diameter filaments are embrittled by the amount of plated metal needed to provide sufficiently low resistance for shielding applications, roughly 1 ohm/ft. Consequently, from a conductivity standpoint, yarns comprised of metallized aramid monofilaments have much higher resistance per unit weight properties, in the range of 18 ohms/mg, compared to about 13 ohms/mg for #36 wire or 5 ohms/mg for #34 wire. Finally, the properties of the polymeric monofilaments themselves limit the temperature and chemical exposure that metallized polymeric yarns can reliably withstand.

Accordingly, it would be desirable to employ a simpler, lower cost metallization process to provide a shielding material consisting of a conductive multi-filament yarn having a small form factor (diameter), high conductivity to weight aspect, excellent flexibility, and the ability to withstand a wide range of thermal and chemical exposure. One approach to such an objective is found in U.S. Pat. No. 7,291,391, issued to Watson et al. on Nov. 6, 2007, wherein the use of an electrolytic metallization process to reduce the resistivity of yarns comprised of micron-diameter stainless steel monofilaments is proposed for use as an electrical resistance heating element for heated car seats.

However, the metallized stainless steel yarn proposed in Watson et al. is not suitable for use in cable shielding applications. Its principal deficiency is that the metallized coating is not uniformly applied around the circumference of each monofilament in the yarn bundle. Indeed, as illustrated in the accompanying figures, most of the monofilaments in the interior of the yarn bundle are not metallized at all. Although details about the metallizing process are not presented in the patent, those skilled in the art will recognize that this result is consistent with the use of conventional wire plating methods wherein single strands of wire are pulled under high tension through long plating baths. When such a process is used to plate a multi-filament yarn bundle, particularly one that is tightly twisted, the axial tension in the yarn compresses the bundle and prevents the plating solution from properly wetting the inner filaments. From a functional standpoint, therefore, the un-plated filaments would represent "dead weight" in an airborne application. Moreover, by concentrating the plating activity at the periphery of the yarn bundle, a high tension process makes it very likely that most if not all of the outer filaments will plate together, thus stiffening the yarn bundle and making it behave more like a solid strand of wire in a braided matrix. Finally, since it would be difficult to reliably remove chemicals trapped within the tightly bound yarn bundle, the use of a high tension plating method presents the risk that long-term corrosion sites will be incorporated into the material.

Military/aerospace cable applications also impose rigorous environmental tests (temperature cycling, shock/vibration, etc.) that stress the adhesion of plated metal coatings to their substrate materials (e.g., silver, or tin coatings plated on copper wire). Although it is well-known that stainless steel has an oxidized or "passivated" surface that must be chemically altered or "activated" in order to achieve good adhesion to plated coatings, Watson et al does not prescribe this pre-conditioning step or, for that matter, even a rudimentary cleaning process to remove any residual lubricants or dirt from the wire drawing process itself.

These deficiencies are overcome in the metallized yarn described in U.S. Pat. No. 10,314,215 issued to the applicant herein, Burke et al. on Jun. 4, 2019, wherein a low tension/low twist electrolytic plating process provides complete and substantially uniform coatings on each of the stainless steel monofilaments. In present practice the '215 yarn has evolved into a 14 filament construction, each filament comprised of a 35 µm stainless steel core plated with a two-part (strike plus acid) copper layer nominally 4.8 µm thick. The copper-plated core is then over-plated with one or more layers of other metals (silver, nickel, tin) in various thicknesses to address a variety of application requirements (corrosion resistance, solderability, etc.). As illustrated in the '215 patent, all plating processes are conducted sequentially in a continuous roll-to-roll production line.

Figure 3:
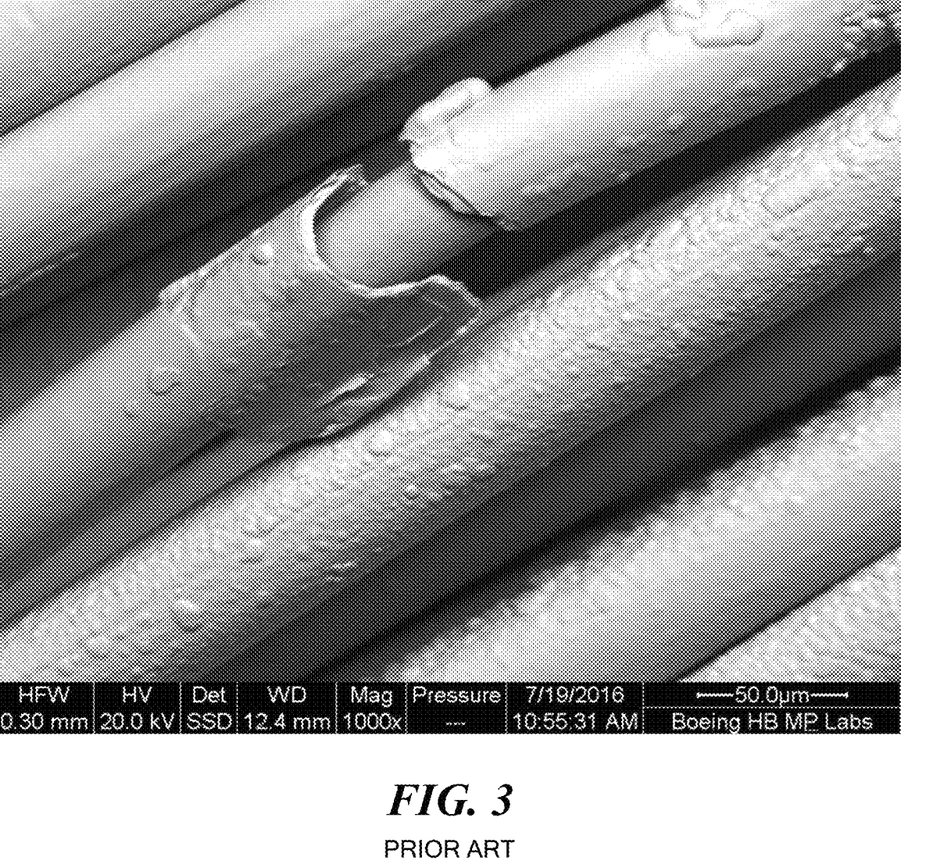
FIG. 3 is a SEM photomicrograph of a '215 "early stage" plating defect.

However, this method of producing lightweight RFI/EMI shielding materials is not without its deficiencies. For example, it has recently been discovered by applicant that this roll-to-roll metallization technique is vulnerable to random microscopic plating anomalies that can become sites for corrosion. The most insidious of these anomalies results in adhesion failure between the first metal layer and the stainless steel core of a monofilament, an "early-stage" defect that is impossible to detect in production or even visualize without the aid of a scanning electron microscope (SEM). A SEM photomicrograph of such a defect is shown in FIG. 3. The probable cause has been determined to be failure of the surface conditioning step to completely "activate" the surface of the 316L stainless steel filaments, leaving passivated chromium oxide sites that inhibit robust copper adhesion. Process adjustments have minimized the incidence of these defects but not achieved the goal of eliminating them entirely. Plating anomalies can also occur in the "later stage" plating processes where metals known for corrosion resistance such as nickel, silver, or tin are coated over the copper layers. These anomalies can take the form of inadequate adhesion, leading to poor abrasion resistance and generation of microscopic particles classified as FOD (Foreign Objects and Debris) in the subsequent braiding process. Micropores in insufficiently plated outer layers can also compromise the corrosion resistance of the metallized yarn in marine environments by providing salt water access to the underlying copper layers. "Later stage" defects also include broken filaments.

Nevertheless, copper is essential to the shielding performance of the '215 construction and the electrodeposition of various corrosion resistant metals remains the most cost-effective means of providing for its protection. Thus, in this invention applicant has been motivated to devise an improved version of the '215 construction that incorporates electroplating methods but does so in a way that eliminates the foregoing anomalies, a task complicated by the need to avoid changing the materials of construction for existing or "Qualified" military/aerospace applications.

BRIEF SUMMARY OF THE INVENTION

The invention provides a RFI/EMI shielding material in the form of a yarn or multi-fiber comprised of a plurality of micron diameter stainless steel monofilaments which have been separately rendered more conductive in the following three-step process. A composite core of copper clad stainless steel (CCSS) is first formed and reduced to an intermediate wire size by drawing or extrusion methods. The clad composite is then transferred to a plating operation where the copper layer is protected by the addition of one or more layers of electrolytically deposited metal or metal alloy with strong oxidation and corrosion resistant properties, or to which solder can bond. The plated composite is then transferred to a final drawing operation where it is reduced to a micron diameter filament, multiples of which are then combined into a yarn or multi-fiber to form a flexible, lightweight RFI/EMI shielding material with improved properties.

The copper cladding is completely and substantially uniformly disposed over the stainless steel core, and the one or more layers of metal or metal alloy electroplated on the clad copper layer are also completely and substantially uniformly plated thereon. The first drawing or extrusion process forms a strong metallurgical bond between the clad copper layer and the stainless steel core that completely eliminates the formation of the "early stage" plating defects inherent in the previous ('215) embodiment. Selected for its high tensile strength and elongation properties, the use of stainless steel is otherwise unusual, if not unique, in that its superior corrosion resistant properties are irrelevant in the copper clad construction. The intermediate plating process serves to maintain the order and type of the various corrosion resistant metals used to form the metallized monofilaments of the previous invention, while the second drawing operation serves to eliminate the "later stage" '215 defects. A novel feature of the invention is found in the unique combination of copper and stainless steel to form the clad composite core of the monofilament, together with the capability to draw the subsequently-plated core to the ultra-fine diameters that distinguish these RFI/EMI shielding materials. In yarn form, the conductive monofilaments provide significant and unexpected improvement in resistance and weight properties compared to their previous embodiments.

Alternatively, the conductive monofilaments of this invention can be fabricated from copper clad low carbon steel (CCS) using drawing or extruding methods to form a clad composite core that can likewise be plated and drawn to the same ultra-fine diameters. Although suitable primarily for applications with reduced tensile strength requirements, these lower cost alternative shielding materials provide comparable improvement in resistance/weight properties and, unexpectedly, improved shielding efficiency at low frequency.

BRIEF DESCRIPTION OF THE SEVERAL VIEWS OF THE DRAWINGS

The invention will be more fully described in the following detailed description taken in conjunction with the accompanying drawings in which.

DETAILED DESCRIPTION OF THE INVENTION

The metallized yarn of this invention is fabricated in a three-step process.

Figure 4A:
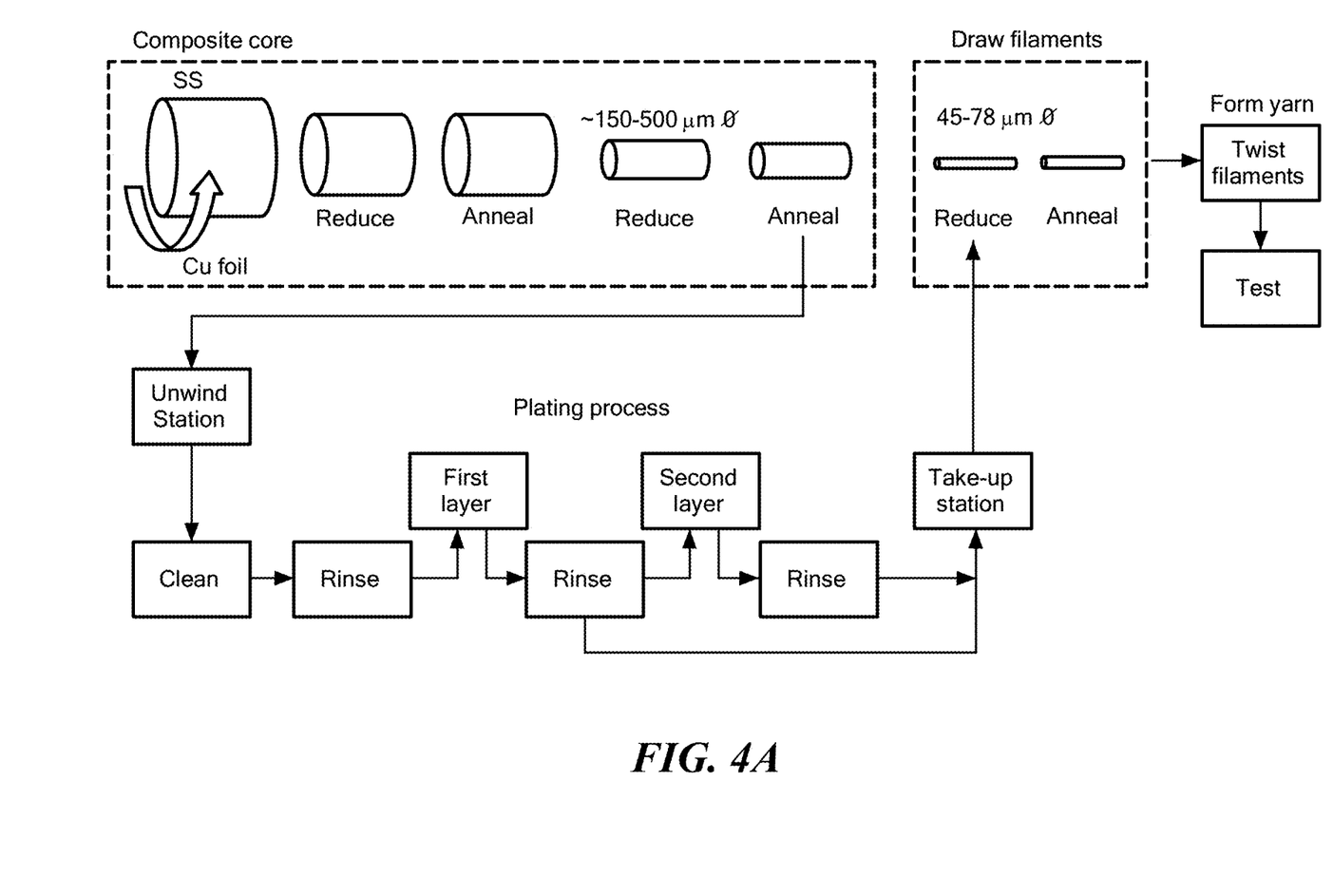
FIG. 4A is a simplified schematic of the steps involved in the formation of the copper clad stainless steel core (CCSS), the subsequent electroplating process, and the final drawing and twisting operations.

Composite core formation. In one preferred embodiment the conductive filaments in the metallized yarns are initially formed from a rod of stainless steel which is circumferentially wrapped with a layer of copper foil which is then welded along its axial seam as the composite core is fed into the first of a series of drawing or size-reducing stations (FIG. 4A). A variety of stainless steels can be utilized, preferably 300 series stainless steel is employed and, more preferably, 316L stainless steel for its high tensile strength and elongation properties. The minimum copper thickness should be not less than about 6% of the radius of the composite core, preferably the minimum copper thickness should be not less than about 10% of the radius of the composite core. Each drawing station consists of multiple dies, usually formed from synthetic diamond, that are arranged in a sequence of progressively smaller openings that are carefully designed to minimize breakage of the drawn material and consequent rethreading of the die set. As the composite CCSS core is pulled through the die openings, the compression of the underside of the copper foil sheath into the surface of the stainless steel core under pressure and temperature creates a metallurgical bond at the interface that is significantly stronger than the bond created by the electrodeposition of copper onto stainless steel. This initial drawing process usually involves more than one set of drawing stations and, in addition to a final annealing step may include one or more heat-treating steps between sets; to avoid oxidation of the surface of the copper sheath such an annealing process would be conducted in an inert atmosphere. In an alternative preferred embodiment, the composite core is fabricated as a copper clad billet of stainless steel and extruded to the same intermediate wire diameter. The limitations regarding minimum clad copper thickness are the same as above. This process likewise produces a metallurgical bond at the clad copper-stainless steel interface that is significantly stronger than the bond created by the electrodeposition of copper onto stainless steel.

Figure 4B:
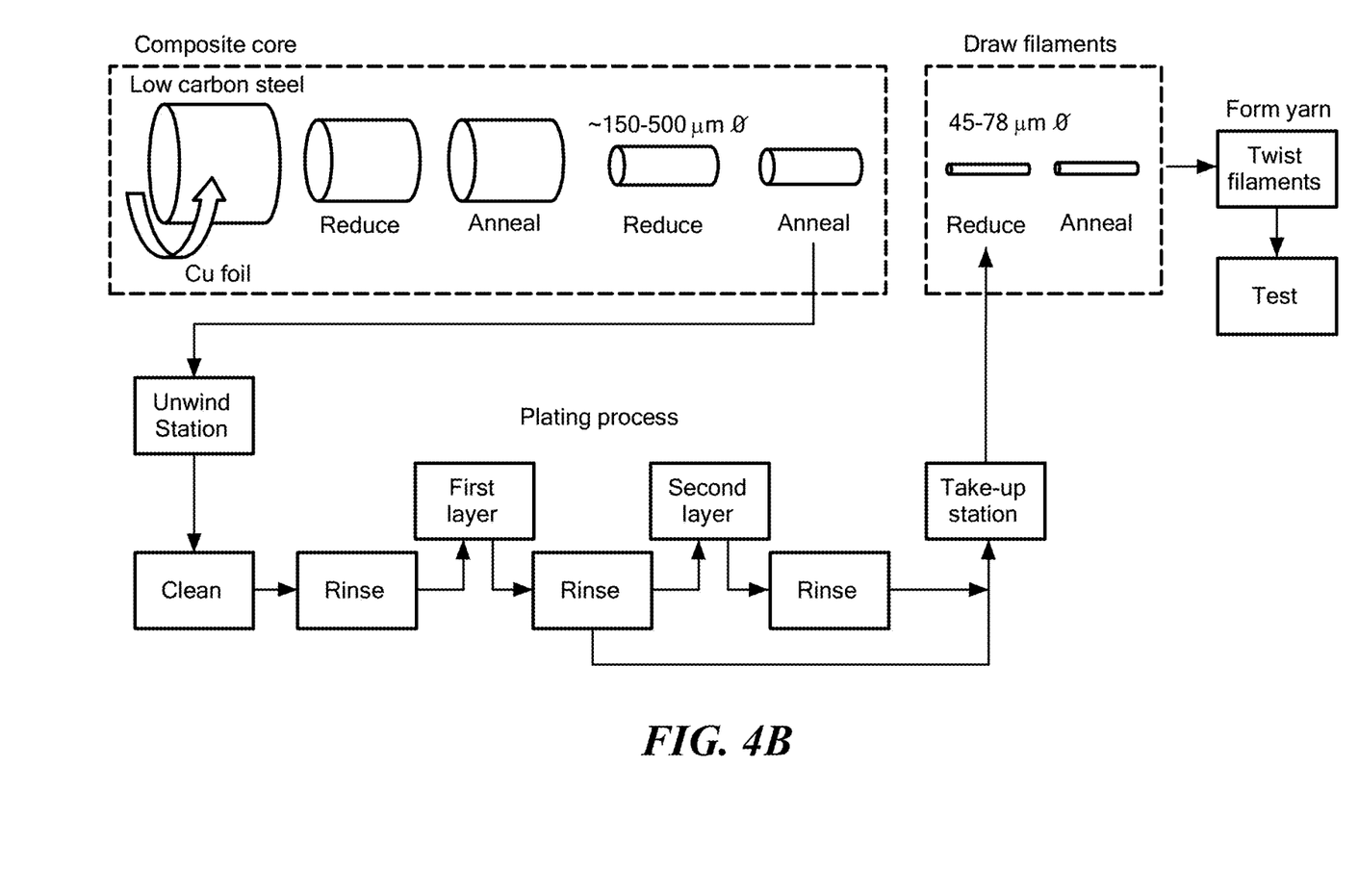
FIG. 4B is the same process as 4A except that low carbon or "mild" steel is used in the formation of the copper clad (CCS) core.

In another preferred embodiment the composite core is formed from a rod of low (<0.25%) carbon or "mild" steel which is circumferentially wrapped with a layer of copper foil which is then welded along its axial seam as the composite CCS core is fed into the first of a series of drawing or size-reducing stations as illustrated in the 4B process schematic. In an alternative preferred embodiment, the composite core is fabricated as a copper clad billet of low (<0.25%) carbon or "mild" steel and extruded to the same intermediate wire diameter. The copper thickness in either case should not be less than about 6% of the radius of the composite core, preferably not less than 10% of the radius of the composite core. In both of these embodiments the temperature and pressure of the reducing process likewise forms a metallurgical bond at the clad copper-low carbon steel interface that is significantly stronger than the bond created by the electrodeposition of copper onto stainless steel. Copper clad steel (CSS) is an attractive alternative to copper clad stainless steel (CCSS): it has good ductility for drawing, is low cost, and readily available from multiple sources. Its only drawback is its tensile strength, roughly 50% that of CCSS, which means that, while eligible for many applications, it cannot be used in Qualified military/aerospace applications without a waiver.

In all of the foregoing embodiments this first process step provides a roughly 150-500 μm diameter composite core that completely eliminates the "early stage" plating defects inherent in the previous ('215) invention.

Composite core plating. The copper clad core is next transported to a plating facility where various protective coatings are applied using electrolytic deposition methods. However, unlike the '215 plating process which involves the low twist-low tension transport of a multi-filament yarn as the last metallizing step, this process involves the transport of individual and relatively larger diameter copper clad wires through the various plating solutions as an intermediate step. This present technique is much more productive in terms of plating capacity and affords better control over the uniformity of the plated deposits. It also provides for improved yarn quality since the stronger CCSS/CCS wires eliminate any prospect of broken filaments as can happen in the '215 process.

As depicted by the alternative paths shown in FIGS. 4A and 4B, a variety of metallized configurations can be produced in this manner. In one path the copper clad stainless steel core (CCSS) is plated with a corrosion-resistant first layer of nickel, tin/tin alloy, brass or gold; different thicknesses can be readily provided by changing the plating process parameters (line speed, rectifier current settings, etc.). Similarly, in another path the copper clad stainless steel core can be plated with a first layer of silver which, in addition to superior high frequency performance, provides corrosion resistance as well as solderability. Gold is also useable as a solderable layer. In another path the copper clad stainless steel core is plated with a first layer of nickel followed by a second layer of silver over the nickel layer; this construction may be preferred where, in the prior embodiment, there is a concern over the long-term diffusion of the copper layer into the silver layer. In another path, the copper clad stainless steel core is plated with a first layer of copper or silver, followed by a second layer of protective metal such as nickel, tin/tin alloy or brass; this construction is useful for applications wherein lower resistivity is desirable and the added weight of the plated copper or silver layer can be tolerated.

All of the foregoing constructions can be replicated with copper clad low carbon steel (CCS) as the composite core material, as shown in FIG. 4B.

Drawing of plated filaments. The plated CCSS or CCS wire is next transferred to the final drawing process where the plated composite core is reduced from a wire diameter in about the 150-500 μm range to a filament diameter in about the 45-78 μm range. This ultra-fine drawing process involves one or more sets of drawing stations each of which consists of multiple dies arranged in a sequence of progressively smaller openings that are carefully designed to minimize breakage of the drawn material and consequent rethreading of the die set. In the preferred embodiment this drawing process also includes a final annealing step and may include one between sets as well; to avoid oxidation of the surface of the drawn filaments, such an annealing process would be conducted in an inert atmosphere. The filaments can also be produced in "hard drawn" form, i.e., not annealed, but being somewhat stiffer are less desirable for use in fabricating complex braided wiring harnesses. As drawn, the multilayer filaments of this invention are produced with extremely smooth, shiny surfaces that are free of corrosion-inducing micropores and, in yarn form, allow the filaments to "nest" or self-adjust to optimize braid "optical coverage".

Ultrafine wires with diameters below 79 μm are routinely drawn and annealed in the wire industry but this practice is almost exclusively confined to copper and aluminum or alloys thereof with homogenous properties such as tensile strength, ductility, and elongation that have an important influence on die design and processing parameters. Over the years, their growing use in weight-sensitive electronic applications and the proliferation of drawing know-how has served to reduce these materials to near-commodity status with widespread availability from multiple sources.

In contrast, the art of drawing the ultrafine plated copper clad stainless steel or plated copper clad mild steel filaments of this invention is not well-known or practiced. These multilayer materials are anything but homogeneous: the tensile strength of stainless steel is roughly 4× that of copper while that of mild steel is approximately 2× that of copper; the tensile properties of the plated nickel, silver, tin/tin alloy or brass layers are quite different from the core materials; the thicknesses and/or number of the plated layers varies from one construction to another; and all of these materials have different annealing profiles. Consequently, the optimum behavior of each construction in the wire drawing process, especially at progressively smaller diameters where breakage potential increases geometrically, can be only determined by extensive trial and error. This necessity, however, is confronted by another reality: despite their suitability for the purposes of this invention, ultrafine filaments incorporating plated copper clad stainless or copper clad mild steel are not particularly useful in other applications due to their fragility and relatively poor conductivity. There has thus been little commercial interest or attention to develop wire drawing technologies for such ultrafine filaments of plated copper clad stainless steel or copper clad mild steel. Nor has there been the recognition of the benefits of such ultrafine filaments of plated copper clad stainless steel or copper clad mild steel, as recognized and implemented by applicant.

Yarn formation. The drawn CCSS or CCS filaments are wound on spools and transferred to a twisting process where, in the preferred embodiment, 14 filaments each roughly 45 μm in diameter are twisted together to form the conductive yarns of this invention. Larger filaments can also be used but diameters in excess of 78 μm provide undesirable performance in terms of reduced shielding effectiveness (SE) due to "windowing" and increased weight. The filament count can be easily expanded to provide yarns with greater processing efficiency in the braiding process; this is not the case with yarns made with the '215 process because larger yarn bundles inhibit the penetration of the plating chemistry to the innermost filaments. The twisting process, which serves to hold the delicate yarn filaments together in the braiding process, imparts a twist of 0.375 tpi (turns per inch); the twist level can be higher or lower but lower levels invite filament breakage while levels above 1 tpi limit the freedom of the individual filaments to spread out and thereby maximize optical coverage.

Testing. The plated yarn is then subjected to a variety of tests for properties and quality. Electrical resistance tests (ohms/unit length) are performed by wrapping the metallized yarn around two probes set 12 inches apart and measuring the resistance with a Chroma 16502 milli-ohm-meter; ten measurements are taken and averaged. Tensile strength and elongation are measured using an Instron 3342 instrument. Plated metal weight is determined by weighing a precisely cut 3 foot length of yarn in a AND HR-200 gram balance and subtracting the basis weight of the yarn; the result is expressed as a percentage of the total yarn weight. Plated metal adhesion is empirically determined by a tape test; the metal should not flake off or adhere to the tape and any change in resistance should not exceed 10%. Solderability is determined by applying 2-3 drops of Kester 951 flux to a test specimen wrapped around Teflon tubing, submerging the specimen in a pot of molten solder for several seconds, and visually inspecting for solder wetting and adhesion.

This invention can be embodied in a variety of forms as revealed in the following examples:

Example 1

As a point of reference, a 500 ft length of yarn comprised of 14 filaments was processed in accordance with the plating methods described in the '215 patent. The combined thickness of the first and second electroplated copper layers on the 35 μm stainless steel filaments was determined by SEM to be a nominal 4.8 μm thick; the second copper layer was electroplated with a third nickel layer nominally 1.2 μm thick, bringing the overall diameter of each filament to 47.0 μm. This reference yarn had an average resistance of 0.85 ohms/ft and weighed an average 64.2 mg/ft.

Example 2

A 500 ft length of yarn was processed in accordance with one of the preferred embodiments of the present invention.

The yarn consisted of 14 drawn CCSS filaments, each comprised of a 35 μm stainless steel core clad with a first layer of copper 4.0 μm thick which was coated with an electroplated nickel layer 1.2 μm thick, resulting in a finished filament diameter of 45.4 μm. The yarn had a resistance of 0.68 ohms/ft, an improvement of 20% over the reference yarn, and weighed 59.8 mg/ft, an improvement of 7% over the reference yarn. The unexpected improvement in resistance versus the '215 example despite a reduction in weight and cross-sectional area of the copper is attributable to the densification of the thinner drawn copper layer compared to the thicker electrodeposited copper layer, which likely also included organic impurities due to the use of brightener additives in the acid copper sulfate plating solution.

Example 3

A 500 ft length of yarn was processed in accordance with one of the preferred embodiments of the present invention. The yarn consisted of 14 drawn CCSS filaments, each comprised of a 35 μm stainless steel core clad with a first layer of copper 4.0 μm thick which was coated with an electroplated silver layer 0.5 μm thick, resulting in a finished filament diameter of 44.0 μm. The yarn had a resistance of 0.65 ohms/ft, and weighed 59.0 mg/ft.

Example 4

A 500 ft length of yarn was processed in accordance with one of the preferred embodiments of the present invention. The yarn consisted of 14 drawn CCSS filaments, each comprised of a 35 μm stainless steel core clad with a first layer of copper 4.0 μm thick which was coated with an electroplated nickel layer 1.2 μm thick which was coated with a silver layer 0.2 μm thick, bringing the finished filament diameter to 45.8 μm. The yarn had a resistance of 0.68 ohms/ft, and weighed 60.5 mg/ft.

Example 5

A 500 ft length of yarn was processed in accordance with one of the preferred embodiments of the present invention. The yarn consisted of 14 drawn CCSS filaments, each comprised of a 35 μm stainless steel core clad with a first layer of copper 4.0 μm thick which was coated with an electroplated copper layer 1.0 μm thick, which was coated with an electroplated nickel layer 1.2 μm thick, resulting in a finished filament diameter of 47.4 μm. The yarn had a resistance of 0.56 ohms/ft, and weighed 64.0 mg/ft. As an alternative, silver can be used in place of copper.

Example 6

A 500 ft length of yarn was processed in accordance with one of the alternative embodiments of the present invention. The yarn consisted of 14 drawn CCS filaments, each comprised of a 35 μm low carbon/mild steel core clad with a first layer of copper 4.0 μm thick which was coated with an electroplated nickel layer 1.2 μm thick, resulting in a finished filament diameter of 45.4 μm. The yarn had a resistance of 0.67 ohms/ft, an improvement of 21% over the reference yarn, and weighed 59.8 mg/ft, an improvement of 7% over reference yarn. The unexpected improvement in resistance versus the '215 example despite a reduction in weight and cross-sectional area of the copper is attributable to the densification of the thinner drawn copper layer compared to the thicker electrodeposited copper layer, which likely also included organic impurities due to the use of brightener additives in the acid copper sulfate plating solution. In braided tubing form, the yarn provided an unexpected improvement in SE at low frequency (below 150 MHz) which is attributable to the lower resistivity of low carbon steel versus that of stainless steel.

Example 7

A 500 ft length of yarn was processed in accordance with one of the alternative embodiments of the present invention. The yarn consisted of 14 drawn CCS filaments, each comprised of a 35 μm low carbon/mild steel core clad with a first layer of copper 4.0 μm thick which was coated with an electroplated silver layer 0.5 μm thick, resulting in a finished filament diameter of 44.0 μm. The yarn had a resistance of 0.64 ohms/ft, and weighed 59.0 mg/ft.

Example 8

A 500 ft length of yarn was processed in accordance with one of the alternative embodiments of the present invention. The yarn consisted of 14 drawn CCS filaments, each comprised of a 35 μm low carbon/mild steel core clad with a first layer of copper 4.0 μm thick which was coated with an electroplated nickel layer 1.2 μm thick which was coated with a silver layer 0.2 μm thick, bringing the finished filament diameter to 45.8 μm. The yarn had a resistance of 0.67 ohms/ft, and weighed 60.3 mg/ft.

Example 9

A 500 ft length of yarn was processed in accordance with one of the alternative embodiments of the present invention. The yarn consisted of 14 drawn CCS filaments, each comprised of a 35 μm low carbon/mild steel core clad with a first layer of copper 4.0 μm thick which was coated with an electroplated copper layer 1.0 μm thick, which was coated with an electroplated nickel layer 1.2 μm thick, resulting in a finished filament diameter of 47.4 μm. The yarn had a resistance of 0.55 ohms/ft, and weighed 63.8 mg/ft. As an alternative, silver can be used in place of copper. The invention is not intended to be limited by the exemplary embodiments described and is intended to encompass the breadth and true scope of the appended claims.

What is claimed is:

1. An RFI/EMI shielding material composed of a conductive multi-fiber having a plurality of metalized monofilaments, each monofilament including:
    a composite core of copper clad stainless steel or low carbon steel reduced to an intermediate diameter;
    a layer of metal or metal alloy electroplated on the clad copper of the composite core;
    wherein each monofilament is drawn after electroplating to a final diameter less than the intermediate diameter.
2. The RFI/EMI shielding material of claim 1 wherein the clad copper is completely and substantially uniformly disposed on the stainless steel or low carbon steel; and
    wherein the layer of metal or metal alloy electroplated on the clad copper layer is completely and substantially uniformly plated thereon.
3. The RFI/EMI shielding material of claim 1 wherein the intermediate diameter is in the range of about 150-500 μm.
4. The RFI/EMI shield material of claim 1 wherein the final diameter is in the range of about 45-78 μm.

5. The RFI/EMI shielding material of claim 1 wherein the electroplated layer is composed of a metal or metal alloy to which solder can bond.

6. The RFF/EMI shielding material of claim 5 wherein the electroplated layer is chosen from the group consisting of silver, tin/tin alloy, brass, and gold.

7. The RFI/EMI shielding material of claim 1 wherein the electroplated layer is composed of a metal or metal alloy resistant to oxidation and corrosion.

8. The RFF/EMI shielding material of claim 7 wherein the electroplated layer is chosen from the group consisting of nickel, tin/tin alloy, brass, and noble metal.

9. The RFF/EMI shielding material of claim 1 wherein the electroplated layer on the clad copper of the composite core is composed of copper or silver; and an additional layer of metal or metal alloy electroplated on the copper or silver layer, wherein the additional layer is composed of a metal or metal alloy resistant to oxidation and corrosion.

10. The RFF/EMI shielding material of claim 9 wherein the additional layer is chosen from the group consisting of nickel, tin/tin alloy, brass, and noble metal.

11. The RFF/EMI shielding material of claim 1 wherein the electroplated layer on the clad copper of the composite core is composed of nickel; and an additional layer of metal or metal alloy electroplated on the nickel layer, wherein the additional layer is composed of a metal or metal alloy to which solder can bond.

12. The RFF/EMI shielding material of claim 11 wherein the additional layer is chosen from the group consisting of silver, brass, and noble metal.

13. The RFF/EMI shielding material of claim 1 wherein the composite core of copper clad stainless steel or low carbon steel is reduced to an intermediate diameter by drawing.

14. The RFF/EMI shielding material of claim 1 wherein the composite core of copper clad stainless steel or low carbon steel is reduced to an intermediate diameter by extrusion.

15. Braided shielding made from the RFI/EMI shielding material of claim 1.

* * * * *